US007999298B2

(12) United States Patent
Kavalieros et al.

(10) Patent No.: US 7,999,298 B2
(45) Date of Patent: Aug. 16, 2011

(54) EMBEDDED MEMORY CELL AND METHOD OF MANUFACTURING SAME

(75) Inventors: Jack T. Kavalieros, Portland, OR (US); Niloy Mukherjee, Beaverton, OR (US); Gilbert Dewey, Hillsboro, OR (US); Dinesh Somasekhar, Portland, OR (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 197 days.

(21) Appl. No.: 12/319,101

(22) Filed: Dec. 30, 2008

(65) Prior Publication Data
US 2010/0163945 A1 Jul. 1, 2010

(51) Int. Cl.
*H01L 27/108* (2006.01)

(52) U.S. Cl. ............... 257/301; 257/E27.093; 257/303; 438/243

(58) Field of Classification Search ............... 257/296, 257/301, 303, E27.09, E27.091, E27.092, 257/E27.093, 534; 438/244, 243
See application file for complete search history.

(56) References Cited

U.S. PATENT DOCUMENTS

| | | | | |
|---|---|---|---|---|
| 4,301,592 A | * | 11/1981 | Lin | ................... 438/98 |
| 4,803,535 A | * | 2/1989 | Taguchi | ................ 257/301 |
| 5,804,848 A | | 9/1998 | Mukai | |
| 5,844,278 A | | 12/1998 | Mizuno et al. | |
| 5,899,710 A | | 5/1999 | Mukai | |
| 6,018,176 A | | 1/2000 | Lim | |
| 6,066,869 A | | 5/2000 | Noble et al. | |
| 6,413,802 B1 | | 7/2002 | Hu et al. | |
| 6,459,123 B1 | | 10/2002 | Enders et al. | |
| 6,472,258 B1 | | 10/2002 | Adkisson et al. | |
| 6,525,403 B2 | | 2/2003 | Inaba et al. | |
| 6,562,665 B1 | | 5/2003 | Yu | |
| 6,583,469 B1 | | 6/2003 | Fried et al. | |
| 6,611,029 B1 | | 8/2003 | Ahmed et al. | |
| 6,630,388 B2 | | 10/2003 | Sekigawa et al. | |
| 6,635,909 B2 | | 10/2003 | Clark et al. | |
| 6,642,090 B1 | | 11/2003 | Fried et al. | |
| 6,657,259 B2 | | 12/2003 | Fried et al. | |
| 6,689,650 B2 | | 2/2004 | Gambino et al. | |

(Continued)

FOREIGN PATENT DOCUMENTS

KR 10-2002-09418 A 2/2002

(Continued)

OTHER PUBLICATIONS

Choi, Yang-Kyu et al., "Sub-20nm CMOS FinFET Technologies", Department of Electrical Engineering and Computer Sciences, University of California, Berkeley, CA, IEEE 2001, 4 pgs.

(Continued)

*Primary Examiner* — Victor Mandala
*Assistant Examiner* — Scott Stowe
(74) *Attorney, Agent, or Firm* — Kenneth A. Nelson

(57) ABSTRACT

An embedded memory cell includes a semiconducting substrate (110), a transistor (120) having a source/drain region (121) at least partially embedded in the semiconducting substrate, and a capacitor (130) at least partially embedded in the semiconducting substrate. The capacitor includes a first electrode (131) and a second electrode (132) that are electrically isolated from each other by a first electrically insulating material (133). The first electrode is electrically connected to the semiconducting substrate and the second electrode is electrically connected to the source/drain region of the transistor.

12 Claims, 4 Drawing Sheets

U.S. PATENT DOCUMENTS

| | | |
|---|---|---|
| 6,770,516 B2 | 8/2004 | Wu et al. |
| 6,787,402 B1 | 9/2004 | Yu |
| 6,794,718 B2 | 9/2004 | Nowak et al. |
| 6,798,000 B2 | 9/2004 | Luyken et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,815,277 B2 | 11/2004 | Fried et al. |
| 6,821,834 B2 | 11/2004 | Ando |
| 6,833,588 B2 | 12/2004 | Yu et al. |
| 6,835,614 B2 | 12/2004 | Hanafi et al. |
| 6,849,884 B2 | 2/2005 | Clark et al. |
| 6,869,868 B2 | 3/2005 | Chiu et al. |
| 6,885,055 B2 | 4/2005 | Lee |
| 6,897,527 B2 | 5/2005 | Dakshina-Murthy et al. |
| 2006/0205143 A1* | 9/2006 | Govindarajan ............ 438/240 |
| 2008/0237678 A1 | 10/2008 | Datta et al. |

FOREIGN PATENT DOCUMENTS

| | | |
|---|---|---|
| KR | 10-2004-79523 A | 9/2004 |
| KR | 10-2008-43143 B1 | 6/2008 |
| KR | 10-2008-48244 A | 6/2008 |
| WO | 2010/078051 A2 | 7/2010 |

OTHER PUBLICATIONS

Park, Jong-Tae et al., "Pi-Gate SOI MOSFET", IEEE Electron Device Letters, vol. 22, No. 8, Aug. 2001, pp. 405-406.

International Search Report and Written Opinion for PCT Patent Publicaiton No. PCT/US2009/068524, mailed on Jul. 9, 2010, 8 pages.

* cited by examiner

EMBEDDED MEMORY CELL AND METHOD OF MANUFACTURING SAME

FIELD OF THE INVENTION

The disclosed embodiments of the invention relate generally to memory cells, and relate more particularly to an embedded memory architecture.

BACKGROUND OF THE INVENTION

The effectiveness of computer memory architectures depends to at least some degree on how quickly the data stored in memory may be accessed. Increasing memory latencies due to limited communication bandwidth between a processing chip and an off-chip memory cell have therefore lead to the development of on-chip memory architectures such as embedded dynamic random access memory, or EDRAM. In one form of EDRAM, the memory element is made up of a single transistor and a single capacitor, and is thus often referred to as a 1T-1C memory cell.

A 1T-1C hybrid memory cell approach involves burying the capacitor element in a semiconductor substrate next to an access transistor, with one of the capacitor plates in contact with the N+ source/drain region of the transistor. Existing 1T-1C EDRAM cells use the bottom electrode of the capacitor to make contact with the access transistor's N+ source/drain region, while the top electrode is contacted by vias/trenches dropped from above the substrate.

BRIEF DESCRIPTION OF THE DRAWINGS

The disclosed embodiments will be better understood from a reading of the following detailed description, taken in conjunction with the accompanying figures in the drawings in which.

Figure 1:
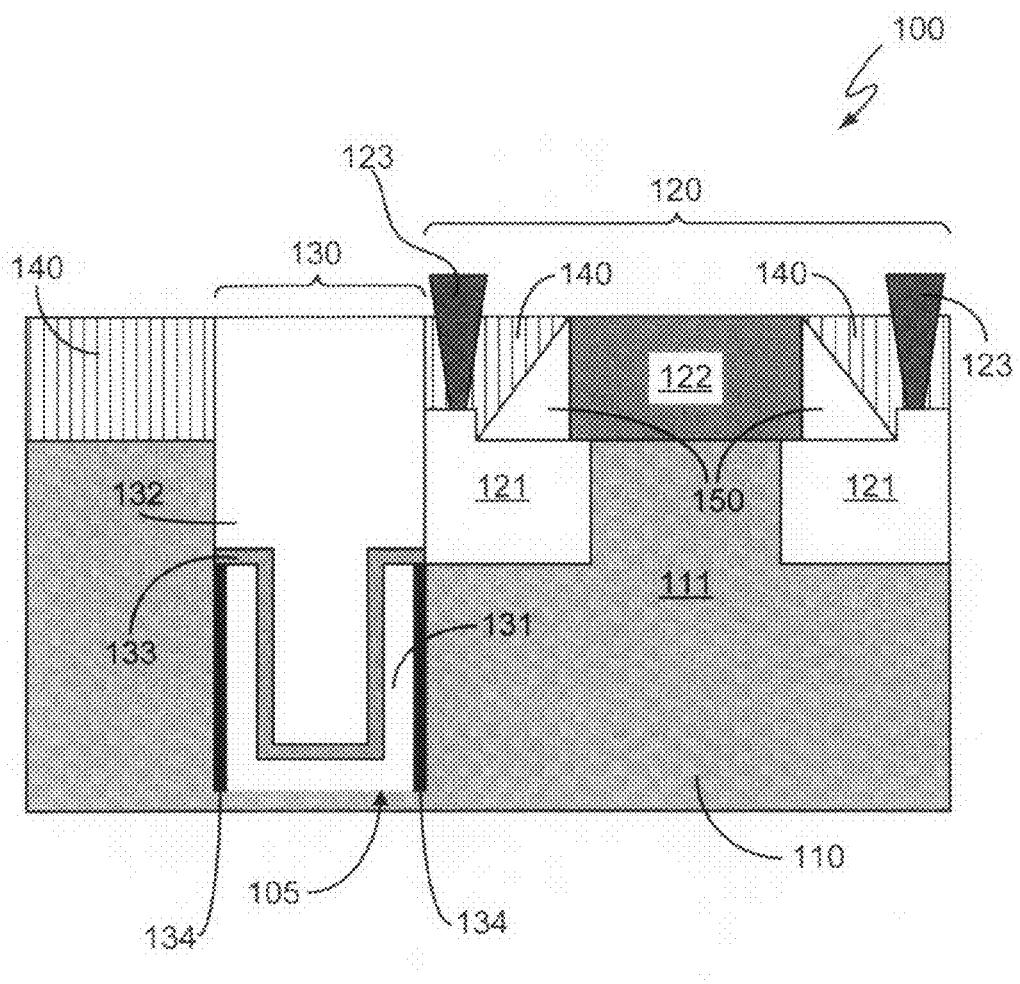
FIG. 1 is a cross-sectional view of an embedded memory cell according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, an embedded memory cell comprises a semiconducting substrate, a transistor having a source/drain region at least partially embedded in the semiconducting substrate, and a capacitor at least partially embedded in the semiconducting substrate. The capacitor comprises a first electrode and a second electrode that are electrically isolated from each other by a first electrically insulating material. The first electrode is electrically connected to the semiconducting substrate and the second electrode is electrically connected to the source/drain region of the transistor.

As mentioned above, a typical architecture for existing 1T-1C EDRAM cell capacitors is to contact the top capacitor electrode with vias or trenches dropped from above the substrate. This architecture requires a larger 1T-1C cell area in order to accommodate the contact structures and also complicates the local-interconnect scheme/process, in part by increasing the local-interconnect density. Another problem arising out of this architecture is that of reduced cell performance due to high contact resistance between the capacitor plates (electrodes) and the semiconductor.

As explained in detail below, embodiments of the invention make feasible a truly "embedded" capacitor, thereby improving the scalability of 1T-1C hybrid technology. As an example, no other external contacts (via a Transistor Contact Network or a Gate Contact Network) need to be made to the capacitor. This eliminates the need for a contact via/trench (for the capacitor) from above the substrate, thus simplifying the interconnect layout. Furthermore, as will also be detailed below, embodiments of the invention enable improved memory cell performance by, for example, reducing contact resistance to the capacitor. As an example, this may be accomplished through the selection of appropriate metals that match the semiconductor doping (i.e., different metals for PWELL vs. N+ source/drain).

Referring now to the drawings, FIG. 1 is a cross-sectional view of an embedded memory cell 100 according to an embodiment of the invention. As an example, embedded memory cell 100 can be an EDRAM cell. As illustrated in FIG. 1, embedded memory cell 100 comprises a semiconducting substrate 110, a transistor 120 (often referred to as an access transistor) having a source/drain region 121 (which in the illustrated embodiment includes a raised portion) at least partially embedded in a body region 111 of semiconducting substrate 110, and a capacitor 130 at least partially embedded in semiconducting substrate 110. Capacitor 130 is located within a trench 105 and comprises an electrode 131 and an electrode 132 that are electrically isolated from each other by an electrically insulating material 133. Transistor 120 further comprises a gate region 122 and source/drain contacts 123. Embedded memory cell 100 further comprises an oxide layer 140 and sidewall spacers 150 adjacent to gate region 122.

In one embodiment, electrically insulating material 133 can be a high-k dielectric material. Silicon dioxide ($SiO_2$), which was widely used in the past as a gate dielectric, has a dielectric constant κ (often written as "k") of approximately 3.9. References in this document to high-k materials mean materials having dielectric constants that are significantly greater than the dielectric constant of $SiO_2$. In practice, such materials typically have dielectric constants of approximately 8-10 or higher (although materials having dielectric constants lower than that may still qualify as high-k materials). Similarly, references herein to a "low-k" material mean materials having a dielectric constant that is low relative to that of $SiO_2$, e.g., materials having dielectric constants less than approximately 3.5.

As illustrated, electrode 131 is electrically connected to body region 111 of semiconducting substrate 110 and electrode 132 is electrically connected to source/drain region 121 of transistor 120. As stated above, this architecture, because it eliminates the need for a top contact to the capacitor, provides density benefits and is more scalable than existing EDRAM architectures. In one embodiment, body region 111 has a p-type doping, meaning transistor 120 and capacitor 130 sit in a PWELL, and source/drain region 121 has an n-type doping.

As has been explained, in the embodiment illustrated in FIG. 1, both bottom and top electrodes (i.e., electrodes 131 and 132) of capacitor 130 make contact with semiconducting substrate 110. Metal-semiconductor contacts are typically non-ohmic, and the interface resistance is quantified by the Schottky Barrier Height (SBH). Reducing the SBH is thus key to improving device performance, especially with scaling. The SBH is also strongly dependent on the nature and extent of the doping in the semiconductor: n-type doping requires a low SBH with the semiconductor conduction band while p-type doping requires a low SBH with the semiconductor valence band. Since, in one embodiment, source/drain region 121 (heavily n-type) and body region 111 (p-type) are oppositely doped, electrodes 131 and 132 may comprise metals of different kinds in order to minimize the relevant n or p SBHs.

Accordingly, in one embodiment metals with large work functions will be used for electrode 131. Large work function metals have low SBH with the semiconductor valence band. As an example, electrode 131 can comprise platinum, palladium, iridium, osmium, or another noble metal, or, more generally, a metal having a work function that is approximately 5 electron volts (eV) or larger. Of the metals listed by name above, iridium has the lowest SBH to the silicon valence band (0.17 eV) and may thus be especially well-suited for the metal of electrode 131, although it should be understood that other factors besides SBH may influence the decision as well.

In the same or another embodiment, metals with small work functions will be used for electrode 132. Small work function metals have low SBH with the semiconductor conduction band. As an example, electrode 132 can comprise erbium, ytterbium, gadolinium, yttrium, or another rare earth element, or, more generally, a metal having a work function that is no greater than approximately 3.2 eV. Of the metals listed by name above, ytterbium has the lowest SBH to the silicon conduction band (0.27 eV) and may thus be especially well-suited for the metal of electrode 132, although it should be understood that, as is the case for electrode 131, other factors besides SBH may also influence the choice of material.

Often a lower contact resistance, more thermally stable, and cleaner metal-semiconductor contact is obtained by generating a chemical reaction between the metal and the semiconductor that results in a reaction product (e.g., silicide for a silicon substrate, germanide for a germanium substrate, germano-silicide for a silicon-germanium substrate, etc.). Accordingly, in certain embodiments, a chemical reaction-generating thermal annealing may be performed after the deposition of each of electrodes 131 and 132, as further discussed below. Thus, in certain embodiments, capacitor 130 further comprises a reaction product (not shown) between semiconducting substrate 110 and at least one of electrode 131 and electrode 132.

In some embodiments, capacitor 130 further comprises a second electrically insulating material located between portions of electrode 131 and semiconducting substrate 110. As an example, such an insulator may be used in order to prevent charge leakage from electrode 131 to source/drain region 121. In the embodiment illustrated in FIG. 1, an electrically insulating material 134 is located along portions of the sidewalls of trench 105. Note that, as should be expected, electrically insulating material 134 is not located at the bottom of trench 105, thus allowing the electrical connection between electrode 131 and semiconducting substrate 110 that has been discussed above. As an example, electrically insulating material 134 can comprise silicon nitride (SiN) or another low-k material or the like.

Figure 2:
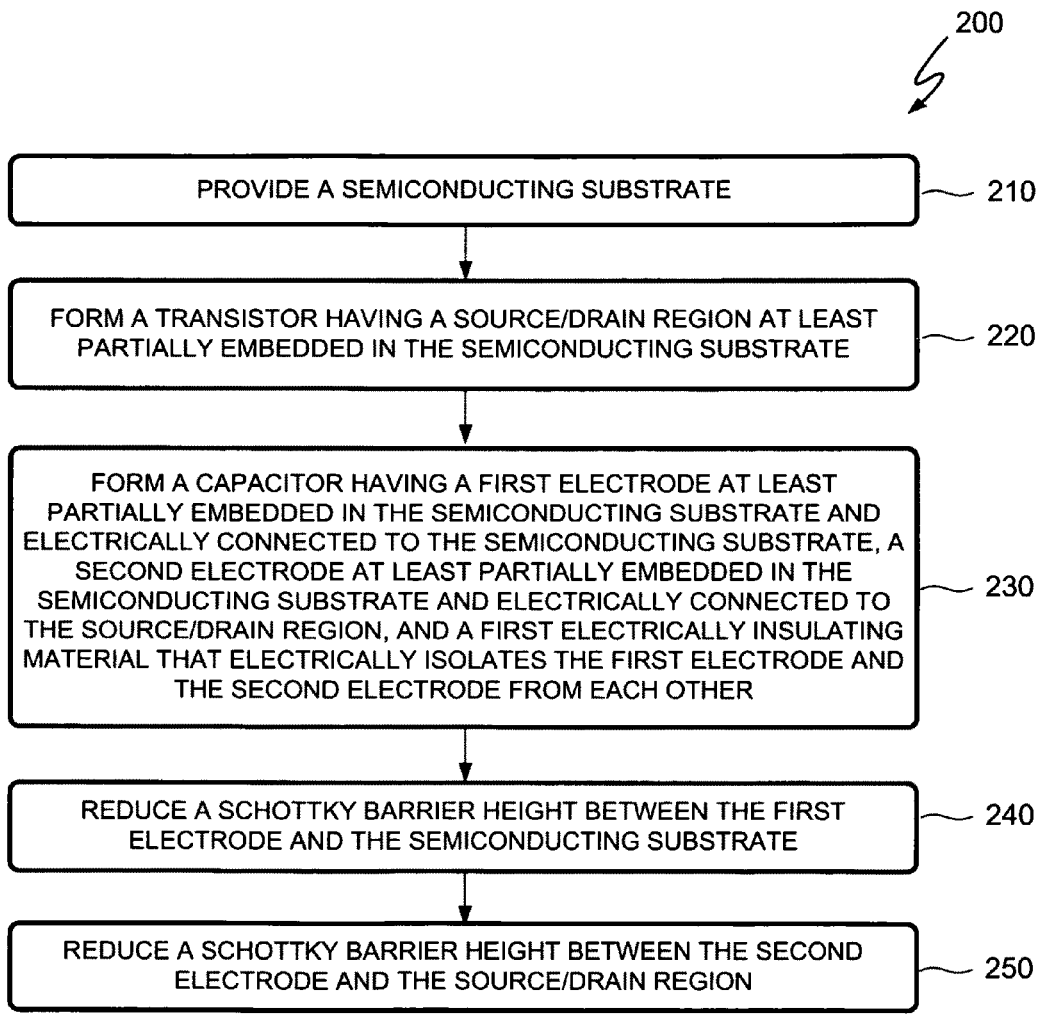
FIG. 2 is a flowchart illustrating a method of manufacturing an embedded memory cell according to an embodiment of the invention.

FIG. 2 is a flowchart illustrating a method 200 of manufacturing an embedded memory cell according to an embodiment of the invention. As an example, method 200 may result in the formation of a memory cell that is similar to embedded memory cell 100 that is shown in FIG. 1.

A step 210 of method 200 is to provide a semiconducting substrate. As an example, the semiconducting substrate can be similar to semiconducting substrate 110 that is shown in FIG. 1.

A step 220 of method 200 is to form a transistor having a source/drain region at least partially embedded in the semiconducting substrate. As an example, the transistor can be similar to transistor 120 that is shown in FIG. 1. Accordingly, the source/drain region can be similar to source/drain region 121, also shown in FIG. 1.

A step 230 of method 200 is to form a capacitor having a first electrode at least partially embedded in the semiconducting substrate and electrically connected to the semiconducting substrate, a second electrode at least partially embedded in the semiconducting substrate and electrically connected to the source/drain region, and a first electrically insulating material that electrically isolates the first electrode and the second electrode from each other. As an example, the capacitor can be similar to capacitor 130 that is shown in FIG. 1. Accordingly, the first electrode, the second electrode, and the first electrically insulating material can be similar to, respectively, electrode 131, electrode 132, and electrically insulating material 133, all of which are shown in FIG. 1.

Because of the relatively large aspect ratio of the trench in which capacitor 130 is formed (e.g., trench 105 in FIG. 1), and because of the requirement for electrodes to be continuous on all surfaces of the capacitor trench, the deposition processes used for the electrodes will most likely be a conformal vapor phase deposition process like Atomic Layer Deposition (ALD) or Chemical Vapor Deposition (CVD) (variants like plasma-enhanced ALD and plasma-enhanced CVD could also be used), or a process using conformal solution based deposition techniques like electroplating or electroless plating. Highly conformal Physical Vapor Deposition (PVD) processes could also be used. Alternatively, a combination of deposition techniques could also be used. For example, electrode 132 could be formed by depositing a PVD seed layer followed by electroplating to fill the remaining volume of trench 105.

A step 240 of method 200 is to reduce a Schottky barrier height between the first electrode and the semiconducting substrate. In one embodiment, step 240 comprises selecting for the first electrode a metal having a high work function if the semiconducting substrate has a p-type doping and selecting for the first electrode a metal having a low work function if the semiconducting substrate has an n-type doping. As mentioned above, step 240 may result in the selection of platinum, palladium, iridium, osmium, another noble metal, or the like.

A step 250 of method 200 is to reduce a Schottky barrier height between the second electrode and the source/drain region. In one embodiment, step 250 comprises selecting for the second electrode a metal having a low work function if the source/drain region has an n-type doping and selecting for the second electrode a metal having a high work function if the source/drain region has a p-type doping. As mentioned above, step 250 may result in the selection of erbium, ytterbium, gadolinium, yttrium, another rare earth element, or the like.

In some embodiments, method 200 further comprises forming a second electrically insulating material between portions of the first electrode and the semiconducting substrate. As an example, the second electrically insulating material can be similar to electrically insulating material 134 that is shown in FIG. 1. As another example, the second electrically insulating material can be formed as part of the formation of the capacitor (step 230) prior to the formation of the electrodes. In that embodiment, a dry etch step or the like may be used to etch away a portion of the electrically insulating material so that the first electrode can make contact with the semiconducting substrate.

In the same or other embodiments, method 200 further comprises forming a reaction product between the semiconducting substrate and at least one of the first electrode and the second electrode. This may involve performing a thermal anneal of the semiconducting substrate and at least one of the first electrode and the second electrode. As an example, the annealing may be done in a temperature range of approximately 200° Celsius (C) to approximately 700° C. for very short times (commonly called flash anneals or spike anneals) or for longer times on the order of a few minutes to a few hours.

Figure 3:
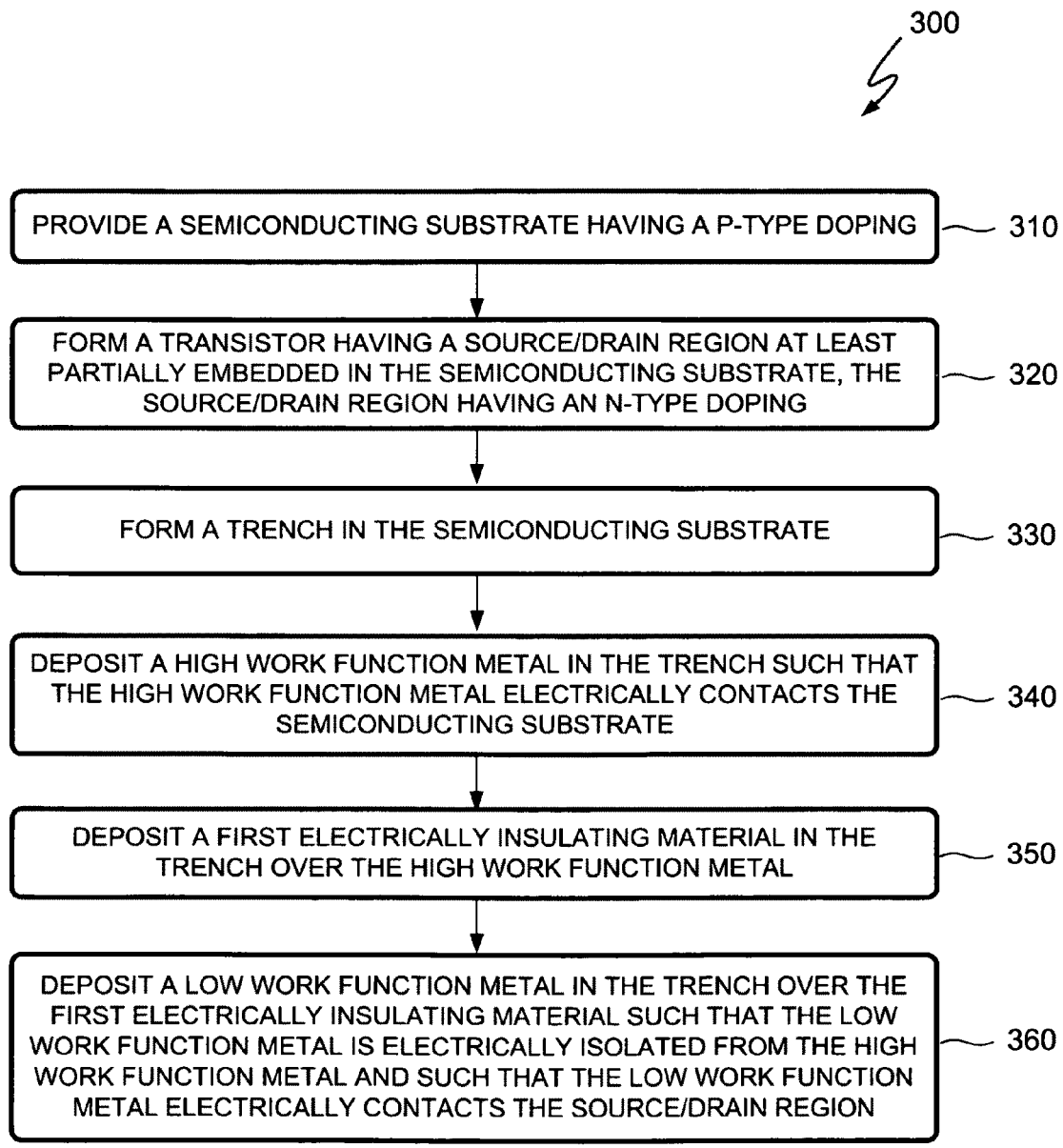
FIG. 3 is a flowchart illustrating a method of manufacturing an embedded DRAM cell according to an embodiment of the invention.

FIG. 3 is a flowchart illustrating a method 300 of manufacturing an embedded DRAM cell according to an embodiment of the invention. As an example, method 300 may result in the formation of a memory cell that is similar to embedded memory cell 100 that is shown in FIG. 1.

A step 310 of method 300 is to provide a semiconducting substrate having a p-type doping. As an example, the semiconducting substrate can be similar to semiconducting substrate 110 that is shown in FIG. 1.

A step 320 of method 300 is to form a transistor having a source/drain region at least partially embedded in the semiconducting substrate, the source/drain region having an n-type doping. As an example, the transistor can be similar to transistor 120 that is shown in FIG. 1. Accordingly, the source/drain region can be similar to source/drain region 121, also shown in FIG. 1.

A step 330 of method 300 is to form a trench in the semiconducting substrate. As an example, the trench can be similar to trench 105 that is shown in FIG. 1. The trench may be formed according to methods and techniques suitable for trench formation as are known in the art.

A step 340 of method 300 is to deposit a high work function metal in the trench such that the high work function metal electrically contacts the semiconducting substrate. As an example, the high work function metal can be used as a bottom electrode of a capacitor, as explained above.

A step 350 of method 300 is to deposit a first electrically insulating material in the trench over the high work function metal. As an example, the first electrically insulating material can be similar to electrically insulating material 133 that is shown in FIG. 1.

Figure 4:
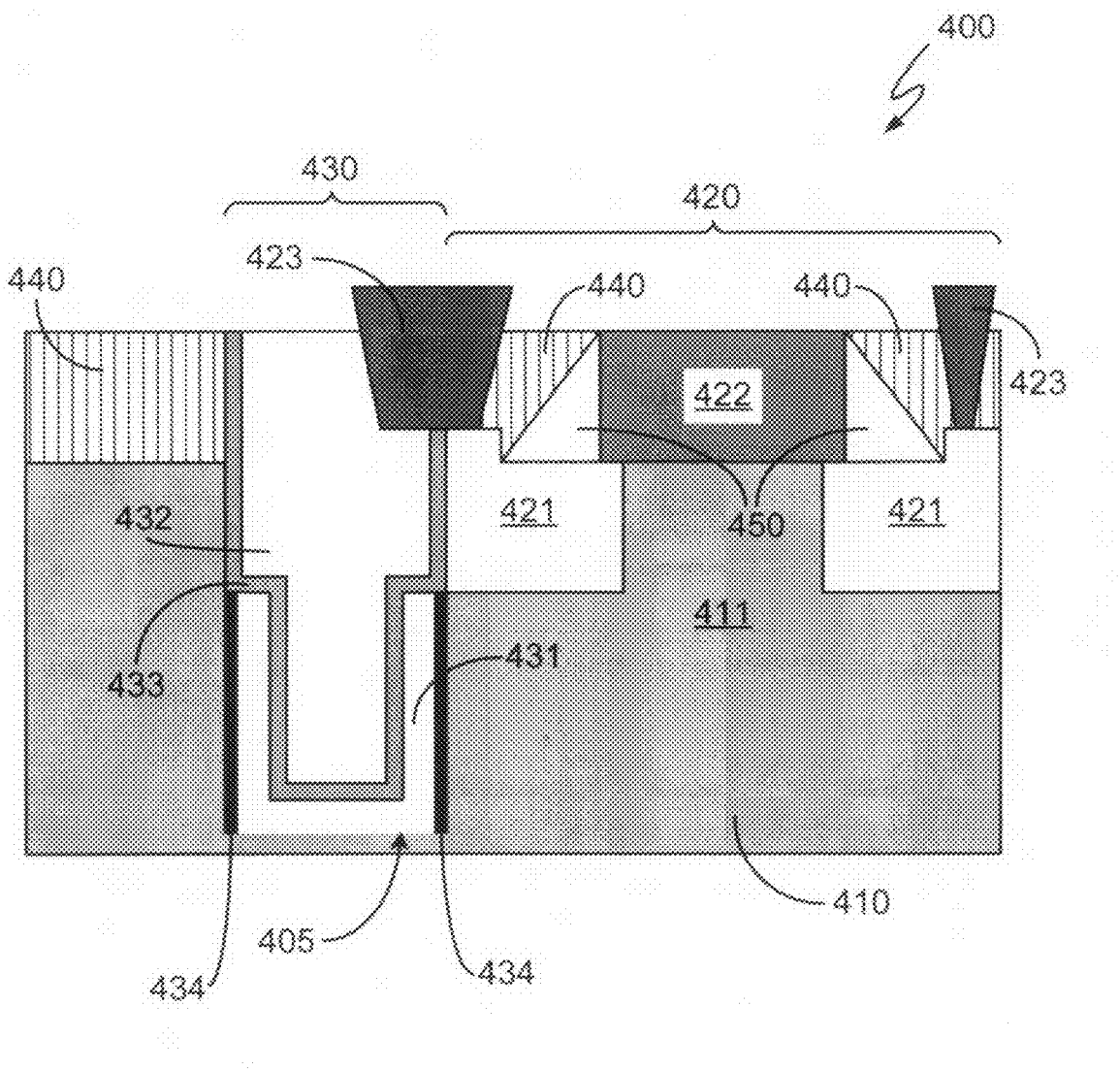
FIG. 4 is a cross-sectional view of an embedded memory cell according to another embodiment of the invention.

In one embodiment, step 350 comprises conformally depositing the first electrically insulating material over the high work function metal with the result being an insulating layer such as that shown in FIG. 1 that extends above a lower edge of source/drain region 121. This technique may involve, in addition to the deposition step, an etch step in which the first electrically insulating material is etched back to the location shown in FIG. 1. Alternatively, a different formation technique may be used that results in an insulating layer as shown in FIG. 1. In a different embodiment, step 350 comprises conformally depositing the first electrically insulating material such that it forms a conformal layer extending to the top of the trench in which the capacitor is being formed. An example of this embodiment is depicted in FIG. 4, which is a cross-sectional view of an embedded memory cell 400 according to an embodiment of the invention. (In FIG. 4, one side of the conformal insulating layer does not reach, or, rather, no longer reaches, the top of the trench, for reasons that will be explained below.)

As illustrated in FIG. 4, embedded memory cell 400 comprises a semiconducting substrate 410, a transistor 420 having a source/drain region 421 (which in the illustrated embodiment includes a raised portion) at least partially embedded in a body region 411 of semiconducting substrate 410, and a capacitor 430 at least partially embedded in semiconducting substrate 410. Capacitor 430 is located within a trench 405 and comprises an electrode 431 and an electrode 432 that are electrically isolated from each other by an electrically insulating material 433. An (optional) electrically insulating material 434 lines lower portions of trench 405. Transistor 420 further comprises a gate region 422 and source/drain contacts 423. Embedded memory cell 400 further comprises an oxide layer 440 and sidewall spacers 450 adjacent to gate region 422. As illustrated, electrode 431 is electrically connected to body region 411 of semiconducting substrate 410 and electrode 432 is electrically connected to source/drain region 421 of transistor 420. As an example, semiconducting substrate 410, transistor 420, source/drain region 421, body region 411, capacitor 430, trench 405, electrode 431, electrode 432, electrically insulating material 433, electrically insulating material 434, gate region 422, source/drain contacts 423, oxide layer 440, and sidewall spacers 450 can be similar to, respectively, semiconducting substrate 110, transistor 120, source/drain region 121, body region 111, capacitor 130, trench 105, electrode 131, electrode 132, electrically insulating material 133, electrically insulating material 134, gate region 122, source/drain contacts 123, oxide layer 140, and sidewall spacers 150, all of which are shown in FIG. 1.

A step 360 of method 300 is to deposit a low work function metal in the trench over the first electrically insulating material such that the low work function metal is electrically isolated from the high work function metal and such that the low work function metal electrically contacts the source/drain region. As an example, the low work function metal can be used as a top electrode of a capacitor, as explained above.

Referring again to FIG. 4, electrode 432 is electrically shorted to transistor 420 by source/drain contact 423 on the left in the figure. Note that the contact etch has also etched back electrically insulating material 433 on the side adjacent to transistor 420. After the contact material has been deposited, the resulting structure, at least in one embodiment, is as depicted in FIG. 4, with electrically insulating material 433 reaching the top of trench 405 on one side and reaching the bottom of source/drain contact 423 on the other side of trench 405. It may be that the contact between electrode 432 and source/drain 421 will be somewhat compromised, but this would be mitigated by the fact that the contact would wrap around the diffusion of source/drain 421. Depositing the electrically insulating material to the top of the trench and then etching back with the contact etch eliminates the need to perform a potentially problematic and/or difficult wet (or other) etch of the thick electrically insulating material alone prior to the deposition of the low work function metal.

In some embodiments, method 300 further comprises forming a second electrically insulating material between portions of the high work function metal and the semiconducting substrate. As an example, the second electrically insulating material can be similar to electrically insulating material 134 that is shown in FIG. 1 and/or to electrically insulating material 434 that is shown in FIG. 4. In one embodiment, the second electrically insulating material can be formed after the formation of the trench (step 330) and before the deposition of the high work function metal (step 340). In that embodiment, a dry etch step or the like may be used to open up the bottom of the capacitor trench so that the high work function metal (the bottom electrode) can make contact with the PWELL.

In the same or other embodiments, method 300 further comprises forming a reaction product between the semiconducting substrate and at least one of the high work function metal and the low work function metal. In one embodiment, this comprises performing a thermal anneal of the semiconducting substrate and at least one of the high work function metal and the low work function metal. As an example, the annealing may be done in a temperature range of approximately 200° C. to approximately 700° C. In one embodiment, the duration of the anneal may be less than approximately 60 seconds. In other embodiments, the duration of the anneal may be on the order of a few minutes to a few hours.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the embedded memory cell and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An embedded memory cell comprising:
a semiconducting substrate;
a transistor having a source/drain region at least partially embedded in the semiconducting substrate; and
a capacitor at least partially embedded in the semiconducting substrate, the capacitor comprising a first electrode and a second electrode that are electrically isolated from each other by a first electrically insulating material,
wherein:
the first electrode is electrically connected to the semiconducting substrate; the second electrode is electrically connected to the source/drain region of the transistor;
if the semiconducting substrate has a p-type doping then the first electrode comprises a metal having a work function of at least 5 electron volts, and if the semiconducting substrate has an n-type doping then the first electrode comprises a metal having a work function no greater than 3.2 electron volts; and
if the source/drain region has a p-type doping then the second electrode comprises a metal having a work function of at least 5 electron volts, and if the source/drain region has an n-type doping then the second electrode comprises a metal having a work function no greater than 3.2 electron volts.

2. The embedded memory cell of claim 1 wherein:
if the semiconducting substrate has a p-type doping then the first electrode comprises a metal selected from the group consisting of platinum, palladium, iridium, and osmium; and
if the semiconducting substrate has an n-type doping then the first electrode comprises a metal selected from the group consisting of erbium, ytterbium, gadolinium, yttrium.

3. The embedded memory cell of claim 1 wherein:
if the source/drain region has a p-type doping then the second electrode comprises a metal selected from the group consisting of platinum, palladium, iridium, and osmium; and
if the source/drain region has an n-type doping then the second electrode comprises a metal selected from the group consisting of erbium, ytterbium, gadolinium, yttrium.

4. The embedded memory cell of claim 1 wherein:
the capacitor further comprises a second electrically insulating material located between portions of the first electrode and the semiconducting substrate.

5. The embedded memory cell of claim 1 wherein:

the capacitor further comprises a reaction product between the semiconducting substrate and at least one of the first electrode and the second electrode.

6. The embedded memory cell of claim 1 wherein:

the first electrically insulating material comprises a high-k dielectric material.

7. A method of manufacturing an embedded memory cell, the method comprising:

providing a semiconducting substrate;

forming a transistor having a source/drain region at least partially embedded in the semiconducting substrate;

forming a capacitor having:

a first electrode at least partially embedded in the semiconducting substrate and electrically connected to the semiconducting substrate;

a second electrode at least partially embedded in the semiconducting substrate and electrically connected to the source/drain region; and a first electrically insulating material that electrically isolates the first electrode and the second electrode from each other; and reducing a Schottky barrier height between the first electrode and the semiconducting substrate by:

selecting for the first electrode a metal having a work function of at least 5 electron volts if the semiconducting substrate has a p-type doping; and selecting for the first electrode a metal having a work function no greater than 3.2 electron volts if the semiconducting substrate has an n-type doping.

8. The method of claim 7 further comprising:

selecting for the first electrode a metal selected from the group consisting of platinum, palladium, iridium, and osmium if the semiconducting substrate has a p-type doping; and selecting for the first electrode a metal selected from the group consisting of erbium, ytterbium, gadolinium, and yttrium if the semiconducting substrate has an n-type doping.

9. The method of claim 7 further comprising:

reducing a Schottky barrier height between the second electrode and the source/drain region by:

selecting for the second electrode a metal selected from the group consisting of erbium, ytterbium, gadolinium, and yttrium if the source/drain region has an n-type doping; and selecting for the second electrode a metal selected from the group consisting of platinum, palladium, iridium, and osmium if the source/drain region has a p-type doping.

10. The method of claim 7 further comprising:

forming a second electrically insulating material between portions of the first electrode and the semiconducting substrate.

11. The method of claim 7 further comprising:

forming a reaction product between the semiconducting substrate and at least one of the first electrode and the second electrode.

12. The method of claim 11 wherein:

forming the reaction product comprises performing a thermal anneal of the semiconducting substrate and at least one of the first electrode and the second electrode.

\* \* \* \* \*